Figure 1:
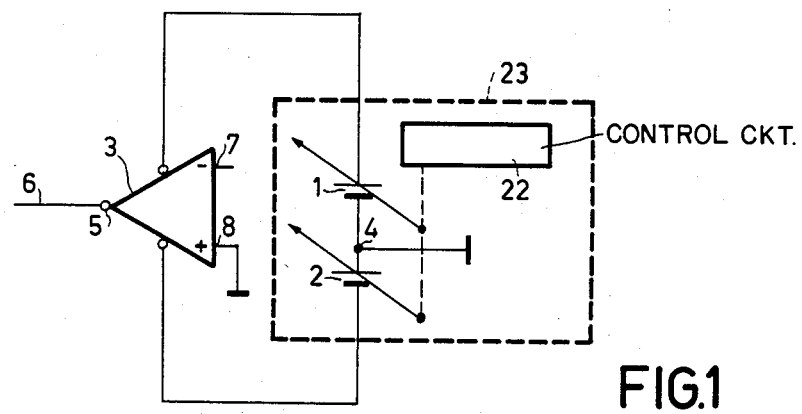

United States Patent [19]

Schoofs et al.

[11] Patent Number: 4,535,303

[45] Date of Patent: Aug. 13, 1985

[54] DRIVER CIRCUIT

[75] Inventors: Franciscus A. C. M. Schoofs; Aloysius J. Nijman, both of Eindhoven, Netherlands

[73] Assignee: U.S. Philips Corporation, New York, N.Y.

[21] Appl. No.: 400,823

[22] Filed: Jul. 22, 1982

[30] Foreign Application Priority Data

Jul. 29, 1981 [NL] Netherlands .......................... 8103572

[51] Int. Cl.³ ............................................. H03F 3/04
[52] U.S. Cl. .................................... 330/297; 330/307;
330/202; 179/70; 179/77
[58] Field of Search ............... 330/297, 202, 307, 262;
179/70, 77

[56] References Cited

U.S. PATENT DOCUMENTS

| | | | |
|---|---|---|---|
| 4,100,501 | 7/1978 | Nakagaki et al. ............... | 330/297 X |
| 4,115,739 | 9/1978 | Sano et al. ....................... | 330/297 X |
| 4,217,556 | 8/1980 | Ito et al. ............................ | 330/268 |
| 4,329,657 | 5/1982 | Kamiya ............................ | 330/297 |

OTHER PUBLICATIONS

Younge, Dale R., "Boot Strapping Bias Supply Increases IC Voltage Capacity", *Electronics*, v. 41, N. 22, 10/28/68, pp. 90–91.

*Primary Examiner*—James B. Mullins
*Assistant Examiner*—Steven J. Mottola
*Attorney, Agent, or Firm*—Thomas A. Briody; William J. Streeter

[57] ABSTRACT

In a driver circuit including at least one integrated circuit amplifier, adapted to be interconnected with a subscriber's line of a telephone system, the operating supply for the amplifier includes a pair of series connected voltage supplies having a maximum sum voltage that exceeds the breakdown voltage of the amplifier. The junction of the voltage supplies is connected to a reference, and the amplitudes of the output voltages of the two supplies are controlled in opposite directions with variations in the amplifier input signal to maintain the effective sum voltages of the supplies below the breakdown voltage of the amplifier. The series connected supplies may be employed to supply the input of a similarly connected second amplifier, with the controlled voltage supply of the second amplifier serving to supply the input of the first amplifier. In this latter arrangement, the amplitudes of the supplies of the two amplifiers are commonly controlled.

10 Claims, 6 Drawing Figures

DRIVER CIRCUIT

The invention relates to a driver circuit comprising at least one integrated amplifier. Driver circuits of this type are inter alia used for driving and supplying a subscriber's line in telephone systems.

BACKGROUND OF THE INVENTION

In telephone systems comprising electronic subscriber line interface circuits ("SLIC's") each wire of a subscriber's line is connected to the output of a separate amplifier, alternatively called a driver, which is part of the stage which is commonly referred to as the driver stage. In the speech condition the subscriber's line is supplied from the exchange, via the drivers, with the direct voltages prescribed by the administrations (and consequently also with a prescribed voltage difference) of 45 V or 60 V between the two wires on which voltages speech signals are superposed. Due to these speech signals and the minimum required voltage drop across the output transistors of the drivers each driver is supplied from a supply source producing a voltage difference which is somewhat larger than the said voltage difference between the two wires.

When the driver is manufactured in integrated form, the breakdown voltage achieved by the integration process used must exceed the supply voltage difference across the driver. This can be easily achieved for a voltage difference of the above-mentioned order of magnitude.

For ringing a subscriber the administrations prescribe an alternating voltage having a frequency of, for example, 50 Hz and a considerably greater amplitude than the above-mentioned supply voltage, for example 95 V. In general, an alternating voltage is applied to each one of the wires of the line, which alternating voltages have a mutually opposite polarity and an equal amplitude. The voltage swing on each of the wires is then equal to the amplitude of the alternating voltage on the line. It is general practice to apply this alternating voltage directly to a ringing signal generator bypassing the driver stage. This has the disadvantage that for each subscriber line a separate switching arrangement is necessary which is capable of switching the alternating voltages having the said amplitude. It is therefore advantageous to apply also the ringing signals to the subscriber line via the driver stage. This requires a supply source voltage which is somewhat larger than the said 95 V ringing voltage swing. It is however disadvantageous to use a supply voltage in the order of this value when integrated drivers are used, as manufacturing the integrated circuits in integrated form with a breakdown voltage of the order of magnitude of this increased supply voltage is difficult and has an adverse effect on the quality of the integrated circuit.

This drawback can be mitigated in a manner as described in the Netherlands Patent Application No. 78 10086 from which it is known to produce the large voltage swing from the output of the drivers by means of a fixed supply voltage difference which is smaller than this voltage swing, the voltage across the integrated circuit always being smaller than the breakdown voltage. This is effected by supplying the driver by means of a floating supply voltage which is locked onto the output signal of the driver stage.

This manner of supplying the drivers has the disadvantage that each driver requires at least one transformer. Transformers are undesirable since they are comparatively expensive and heavy, produce disturbing electro-magnetic stray fields and cannot be manufactured in integrated form.

SUMMARY OF THE INVENTION

It is an object of the invention to eliminate the above-described disadvantages and to provide a simple driver circuit in which the drivers are supplied with a variable supply voltage having a peak-peak value which exceeds the threshold voltage of the integrated drivers.

In order to accomplish this, the driver circuit according to the invention is characterized in that it comprises a series arrangement of at least a first and a second voltage-controllable direct voltage supply source having a maximum sum voltage which exceeds the breakdown voltage of the integrated amplifier, that the negative pole of the first supply source is connected to the positive pole of the second supply source, that the junction point of the supply sources is connected to a reference voltage and that a control arrangement is provided connected to the supply sources for controlling the individual voltages of the supply sources as a function of the instantaneous value of the amplifier output signal, the sum voltage of the supply sources being kept below the breakdown voltage of the integrated amplifier.

This measure in accordance with the invention furnishes the advantage that the voltage swing from the driver output may exceed the breakdown voltage of the integrated circuits from which is assembled. The said series arrangement need of course not necessarily be limited to two voltage sources but may be formed from any optional larger number of supply sources.

If controlled direct voltage sources are provided in a telephone system as the voltage source, it is advantageous to use these sources also as signal sources. It is true that one and the same source cannot perform the combined functions of supply source and signal source for one driver, but in telephone systems at least two drivers are used for each subscriber circuit. In that case an advantageous combination of the signal and supply functions in one control voltage source is very well possible. For one driver there are then two controllable direct voltage sources serving as a supply source and two controllable direct voltage sources serving as a signal source. With these voltage sources a driver circuit is produced which is characterized in that the junction point of the first and second supply sources is connected to an input of the amplifier via a parallel arrangement of a first series arrangement of a third controlled direct voltage supply source and a first resistor on the one hand and a second series arrangement of a fourth controlled direct voltage supply source and a second resistor on the other hand, that the negative pole of the third supply source is coupled to the positive pole of the fourth supply source and that the output and the input of the amplifier are interconnected via a third resistor.

This driver circuit has the advantage that by adding only a few additional resistors it can be combined with a second driver stage so that this driver circuit incorporates a supply arrangement which has also a signal generating function, it not being necessary to provide additional voltage sources and an additional control therefor.

BRIEF FIGURE DESCRIPTION

Figure 2:
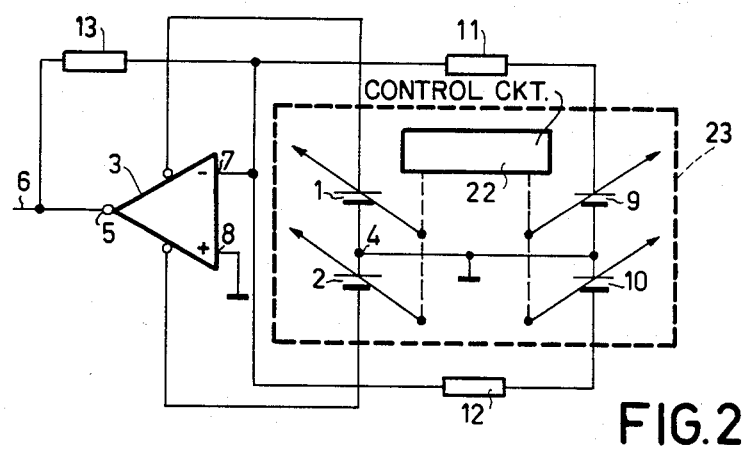
Figure 3:
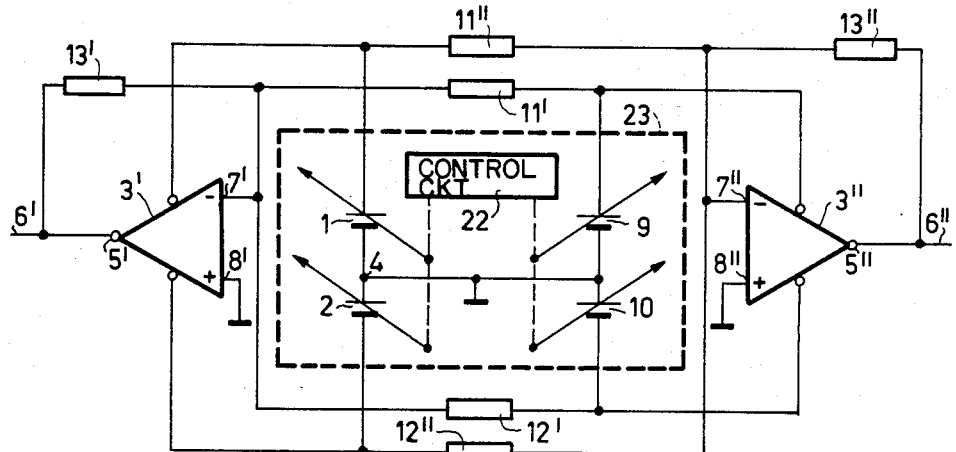
Figure 4:
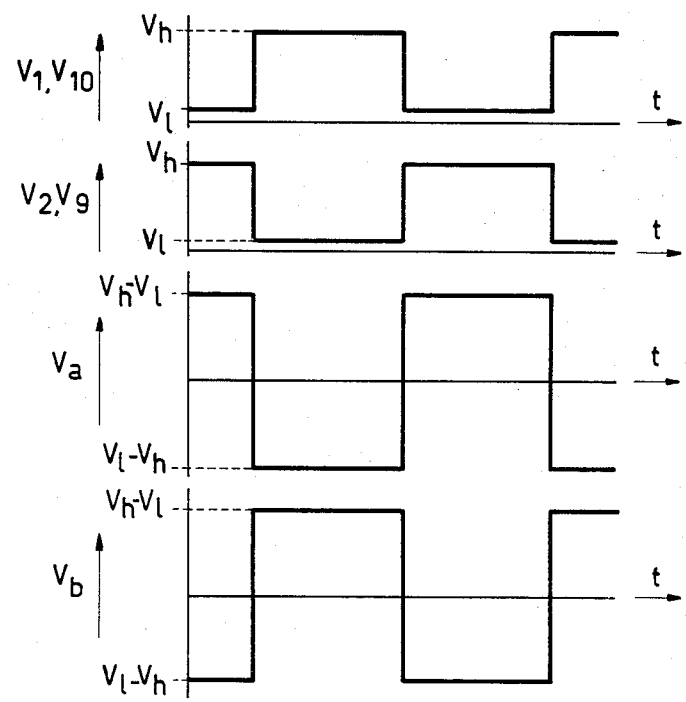
Figure 5:
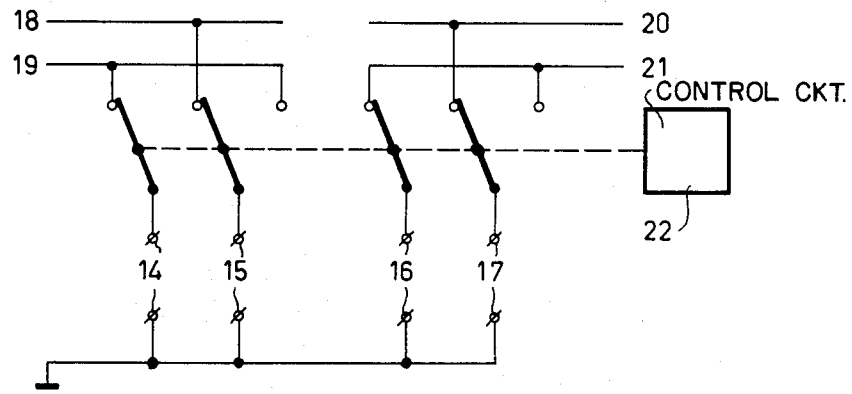

The invention and its advantages will now be further described by way of example with reference to the embodiments shown in the accompanying Figures, corresponding components in the different Figures being given the same reference numerals. Herein:

FIG. 1 shows an embodiment of a driver circuit incorporating a supply arrangement in accordance with the invention, FIG. 2 shows an other embodiment of a driver circuit incorporating a supply arrangement in accordance with the invention, FIG. 3 shows a further embodiment of a driver circuit incorporating a supply arrangement in accordance with the invention comprising both supply sources and signal sources, FIG. 4 shows an example of voltage wave forms such as may occur in a driver circuit shown in FIG. 3, FIG. 5 shows an embodiment of a supply arrangement for use in a driver circuit as described with reference to the FIGS. 1, 2 or 3, FIG. 6 shows an example of voltage wave forms such as may occur in the driver circuit and the supply arrangement described with reference to FIG. 3 and FIG. 5, respectively.

DETAILED DISCLOSURE

FIG. 1 shows an amplifier 3 which is supplied by two direct voltage sources 1 and 2 which are arranged in series in the same polarity and whose junction point 4 is connected to a reference voltage of, for example, $-50$ V with respect to ground. Voltage source 1 is connected to the amplifier 3 by means of its positive pole and voltage source 2 is connected to this amplifier by means of its negative pole. In this manner, the amplifier 3 is connected between a point having a high supply potential and a point having a low supply potential. The value of the high supply potential with respect to the reference voltage is designated the positive supply voltage, the value of the low potential is designated the negative supply voltage. Each of the voltage sources 1 and 2 produces a direct voltage which is controlled by a control arrangement 22 which is part of a supply arrangement 23, which will be further described with reference to FIG. 5.

In telephony the amplifier 3 is used in a stage which is commonly referred to as a driver stage, which is preferably manufactured in integrated form. The output 5 of this amplifier 3 is then connected to one of the wires, for example wire 6 of a subscriber's line. The amplifier 3 has a signal-inverting input 7 which is used as the control signal input and a signal noninverting input 8 connected to the reference voltage.

For special line signals, for example ringing signals obtained by driving the signal-inverting input 7 there is produced on the amplifier output 5 an a.c. voltage whose peak-peak value is higher than the breakdown voltage of the amplifier integrated circuits of a conventional construction. It will be obvious that the instantaneous value of the output a.c. voltage is always located between the positive and the negative supply voltages. For fixed-voltage voltage sources this results in the supply voltage difference across the amplifier 3 being greater than the breakdown voltage of the integrated circuits in this amplifier, resulting in destruction of these circuits. Consequently, the sum voltage of the voltage sources 1 and 2, and thus the supply voltage difference, must be limited to a value which is less than the said threshold voltage so that the desired signals cannot be generated therewith. To render it nevertheless possible to generate these signals, each of these voltage sources 1 and 2 is in the form of a controllable voltage source. In addition, the voltage sources 1 and 2 are controlled in the rhythm of the a.c. voltage with which the amplifier is driven. A simple mode of controlling the voltage sources is a mode in which each voltage source is switched between a low voltage condition ("off") and a high voltage condition ("on"), the low voltage for both voltage sources having the same value, which also applies to the high voltage. When the amplifier output 5 has a voltage which is positive with respect to the reference voltage, voltage source 1 is "on" and voltage source 2 is "off"; when the amplifier output has a negative voltage, voltage source 2 is "on" and voltage source 1 is "off". The high voltage then has a value which is somewhat higher than the positive as well as the negative peak value of the output voltage with respect to the reference level. A great advantage of such a control is that the sum of the values of the low and the high voltages is lower than the breakdown voltage of the integrated circuits.

For a proper operation of the output transistors of the integrated circuits the positive supply voltage must always be a predetermined minimum value more positive than the output voltage of the amplifier, while the negative supply voltage must be more negative than this output voltage by the same minimum value. This value, the space which is commonly referred to as the minimum collector space is of the order of magnitude of 3 V.

But for the minimum collector space, it is possible at the said control of the voltage sources 1 and 2 to choose the sum voltage of these voltage sources 1 and 2 substantially equal to the breakdown voltage of the integrated circuits of the amplifier 3. In this manner it is possible to realize a voltage swing on the amplifier output 5 of approximately twice the breakdown voltage of the integrated circuit in the amplifier 3. Moreover, the voltage variation of the voltage sources 1 and 2 is not necessarily limited to square-wave voltages, as will be described hereinafter. A very great number of other voltage variations are possible, provided the requirements that the supply voltage difference across the amplifier 5 is always kept below the breakdown voltage of the integrated circuits in this amplifier, that the positive supply voltage is always somewhat more positive than the output voltage and that the negative supply voltage is always somewhat more negative than the output voltage are satisfied.

As shown in FIG. 2, the inverting input 7 of amplifier 3 can be driven by means of two further voltage sources 9 and 10. Each of the voltage sources 9 and 10 produces a direct voltage the magnitude of which is controlled by a control arrangement 22 forming part of a supply arrangement 23 which will be discussed in greater detail with reference to FIG. 5. The negative pole of voltage source 9 is connected to the positive pole of voltage source 10 and to the reference voltage. The positive pole of voltage source 9 is connected to the signal-inverting input 7 of amplifier 3 via a resistor 11, the negative pole of voltage source 10 is also connected to this input via a resistor 12. Amplifier 3 is fed back via a resistor 13 which is provided between the amplifier output 5 and the signal-inverting input 7 of the amplifier. The resistors 11, 12 and 13 have the same rated values. The fedback amplifier 3 has such a high gain that the voltage at input 7 may always be disregarded compared with the voltage on output 5; at the same time the input voltage is so low that it may be disregarded with respect to the currents through the resistors 11, 12 and 13.

To explain how the drive of input 7 of amplifier 3 functions, let it be assumed that voltage source 9 has the same voltage variation as voltage source 2 and that voltage source 10 has the same voltage variation as voltage source 1. The output voltage of amplifier 3 with respect to the reference voltage is always equal to the difference voltage of the voltage sources 9 and 10, the resistors 11, 12 and 13 having the same resistance values. This output voltage is positive with respect to the reference voltage for the period of time during which voltage source 10 produces a higher voltage than voltage source 9 and is negative for the period of time during which voltage source 10 produces a lower voltage than voltage source 9. If voltage source 9 is controlled such that for the period of time during which amplifier 3 produces a positive voltage output it always produces a voltage of, for example, 3 V then during this period the positive supply voltage—because voltage source 1 produces the same voltage as the voltage source 10—is always 3 V higher than the output voltage. In this manner it is possible to realize a collector space of 3 V of the positive supply voltage. The collector space of the negative supply voltage can be obtained by having voltage source 10 produce a voltage of, for example, 3 V for the period of time during which the output voltage of the amplifier 3 is negative.

Although, for the sake of convenience it is assumed that the voltage sources 1 and 10 produce mutually identical voltages, as do also the voltage sources 2 and 9, this is not an absolute requirement for a proper functioning of the drive and the supply of amplifier 3. As can be easily demonstrated, it is only required that the sum of the voltages produced by the voltage sources 1 and 9 is greater than or equal to the sum of the voltage from voltage source 10 and the minimum collector space if the voltage used by voltage source 10 exceeds the voltage produced by voltage source 9, and, if the voltage produced by voltage source 9 exceeds the voltage produced by voltage source 10, that the sum of the voltages from the voltage source 2 and 10 is greater than or equal to the sum of the voltages from voltage source 9 and the minimum collector space, while all times the sum of the voltages from the voltage sources 1 and 2 must be less than the breakdown voltage of the integrated circuits of amplifier 3.

An embodiment of a driver circuit in accordance with the invention for supplying and driving a two-wire subscriber line is shown in FIG. 3. This driver circuit comprises two amplifiers 3' and 3" of the type as described with reference to FIG. 2. The amplifiers are provided with a supply arrangement 23, which will be described in greater detail, in combination with the control arrangement 22, with reference to FIG. 5. In the embodiment of the driver circuit in accordance with the invention shown in FIG. 3 the voltage sources operate as the supply sources for one of the two amplifiers 3' and 3" and as signal sources for the other amplifier. A portion of the elements shown in FIG. 3 are jointly used by the two amplifiers 3' and 3"; in FIG. 3 these elements are given a reference number without accent notation. Of the remaining elements a first portion is associated with amplifier 3', which elements are denoted by a primed reference number; the other portion is associated with amplifier 3", these elements being denoted by a reference number with a double dash mark.

In this driver circuit the control voltage sources 1 and 2 function as supply sources for amplifier 3' and as signal sources for amplifier 3"; the controlled voltage sources 9 and 10 are supply sources for amplifier 3" and signal sources for amplifier 3'.

In order to explain the operation of this driver circuit let it be assumed for the sake of convenience that all voltage sources have a periodical square-wave voltage variation as shown in FIG. 4.

Then during a first portion of the period the voltages $V_1$ and $V_{10}$ of the voltage sources 1 and 10, respectively have a comparatively high value $V_h$ of, for example, 50 V and the voltages $V_2$ and $V_9$ of the voltage sources 2 and 9, respectively, have a comparatively low value $V_1$ of, for example, 3 V, and inversely during the other portion of the period.

During the first portion of the period the voltage $V_a$ of wire 6' with respect to the reference is equal to the difference between the high and the low voltages; during this first portion of the period the voltage $V_b$ of the wire 6" with respect to the reference is equal to the difference between the low and the high voltages. The voltage difference between the wires 6' and 6" is now twice the difference between the high and the low voltages. During the other portion of the period the voltage difference between the wires 6' and 6" has changed its sign so that the total voltage swing of the a.c. voltage between these wires is four times the difference between the high and the low voltages.

The collector space of, for example, not less than 3 V can be realized in the same manner as described with reference to FIG. 2.

During the first portion of the period the voltage at the amplifier output 5' is positive with respect to the output 5", so that the line current flows from output 5' to output 5". This current is applied to amplifier 3' by voltage source 1 and withdrawn from amplifier 3" by voltage source 10. The voltage difference between the positive side of voltage source 1 and amplifier output 5' is equal to the low voltage of, for example, 3 V as is also the voltage difference between amplifier output 5" and the negative side of voltage source 10. The instantaneous heat generation in the output transistor of each of the two amplifiers 3' and 3" is now substantially equal to the product of the line current and the low voltage. During the other portion of the period the line current flows in the opposite direction and supply current for the amplifier 3' and 3" is produced by the voltage source 2 and 9, respectively. During both portions of the period the heat generation is equal. By limiting the low voltage to the value required for the minimum collector space it is therefore possible to limit the dissipation in the amplifier 3' and 3" to a minimum value. This is of particular advantage for amplifiers manufactured in integrated form.

For a proper functioning of the driver circuit of FIG. 3 it is not necessary for the voltages produced by the voltage sources 1, 2, 9 and 10 to vary as described by way of example with reference to FIG. 4. Hereafter, for example it is described that also other voltage variations of these voltage sources are possible, provided they satisfy the same conditions as already described hereinbefore for one amplifier that: 1. the sum of the voltages produced by the voltage sources 1 and 9 is larger than or equal to the sum of the voltage from voltage source 10 and the minimum collector space if the voltage from voltage source 10 exceeds the voltage from voltage source 9, 2. in addition, the sum of the voltages from the voltage sources 2 and 10 is larger than or equal to the sum of the voltage from voltage source 9 and the minimum collector space if the voltage from voltage source 10 is smaller than the voltage from the voltage source 9. 3. in addition, the sum of the voltages from the voltage sources 1 and 9 is larger than or equal to the sum of the voltage from the voltage source 2 and the minimum collector space if the voltage from voltage 2 exceeds the voltage from voltage source 1, 4. in addition, the sum of the voltages of the voltage sources 2 and 10 is larger than or equal to the sum of the voltage from the voltage source 1 and the minimum collector space if the voltage from voltage source 2 exceeds the voltage from voltage source 1 and 5. that at all times the sum of the voltages from the voltage sources 1 and 2 and the sum of the voltages from the voltage sources 9 and 10 is smaller than the breakdown voltage of the integrated circuits in the amplifiers 3' and 3''.

An embodiment of the supply arrangement incorporating the variable voltage sources 1, 2,9 and 10 is shown in FIG. 5. This supply arrangement has four pairs of terminals 14 to 17, inclusive, each consisting of a zero voltage terminal connected to the reference voltage and a voltage terminal. Each of the voltage terminals of the pairs 14 and 15 is periodically connected to alternately a first point 18 of a comparatively high voltage which voltage is positive with respect to the reference voltage of, for example, 50 V, and a second point 19 of a constant comparatively low voltage of, for example, 3 V, which voltage is also positive with respect to the reference voltage. Each of the voltage terminals of the pairs 16 and 17 is periodically connected to alternately a first point 20 carrying a comparatively high voltage, which voltage is negative with respect to the reference voltage, and a fourth point 21 of a constant, comparatively low voltage of, for example, $-3$ V, which is also negative with respect to the reference voltage. The connections are established by means of switches arranged between the voltage terminals and the voltage points. These switches are simultaneously switched under the control of a control unit 22, still to be described hereinafter, so that the voltage terminal of the pairs 14 and 16 are connected to the comparatively high voltage if the voltage terminals of the pairs 15 and 17 are connected to the comparatively low voltage, and inversely. When the supply arrangement of FIG. 5 has a combined supply and signal function as described with reference to FIGS. 2 and 3, the terminals of voltage sources 1, 2, 9 and 10 in the FIGS. 2 and 3 are formed by the terminals of the respective pairs of terminals 14, 17, 15 and 16 in FIG. 5.

In a first embodiment of the present supply arrangement the voltage on point 18 has a constant value of, for example, 50 V with respect to the reference voltage, while the voltage on point 20 has a constant value of, for example, $-50$ V with respect to the reference voltage. These 50 V and $-50$ V voltages may both be obtained from, for example, a battery. The supply arrangement now produces four square-wave voltages having mutually equal amplitudes and periods.

Figure 6:
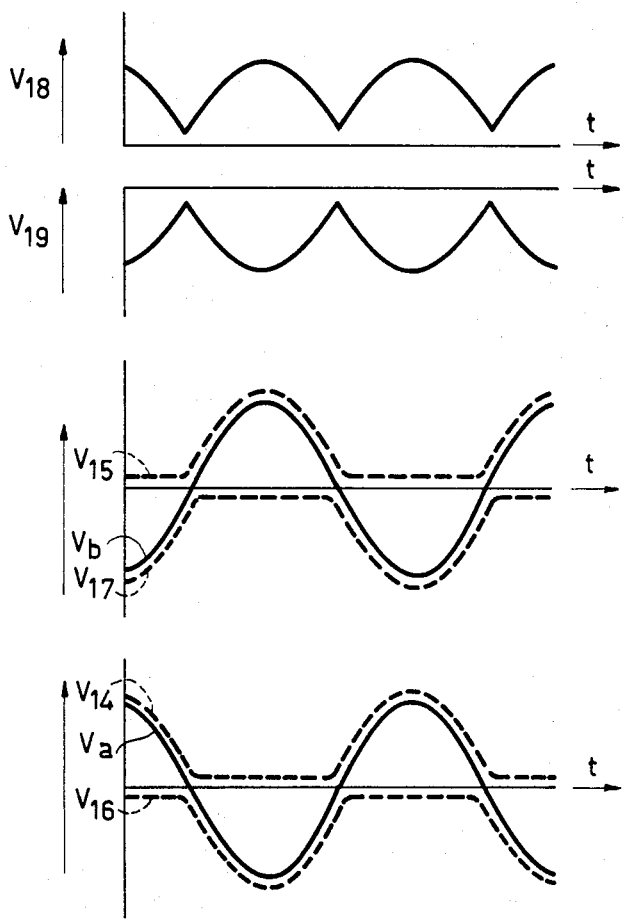

In a second embodiment of the supply arrangement the voltage $V_{18}$ of point 18 varies with respect to the reference voltage in a way as shown in the topmost curve of FIG. 6. This voltage consists of the sum of a full-wave rectified sinusoidal a.c. voltage having an amplitude of, for example, 95 V and a direct voltage of, for example, 3 V. The voltage $V_{20}$ on point 20 varies with respect to the reference voltage in an identical manner as the voltage on point 18, but has the opposite polarity. The voltages on the points 18 and 20 may for example be obtained by arranging the respective positive and negative full-wave rectified sinusoidal a.c. voltage from the ringing generator in series with a battery of $+3$ V and $-3$ V, respectively.

Switching the voltage terminals from the points carrying a high voltage to the points carrying a low voltage and inversely is effected for all pairs of terminals at the instant at which $V_{18}$ reaches a minimum value. The voltages $V_{14}$, $V_{15}$, $V_{16}$ and $V_{17}$ across the respective pairs of terminals 14, 15, 16 and 17 are shown in FIG. 6 as broken lines in the third and fourth curves. When the supply arrangement in accordance with this embodiment, having a combined supply and signal function as described with reference to FIG. 3 is used, the voltages $V_a$ and $V_b$ of the wires 6' and 6'', respectively vary with respect to the reference voltage in a manner as represented by solid lines in FIG. 6 in the third and fourth curves.

In FIG. 3, the connections between the voltage terminals of the pairs of terminals 14 to 17, inclusive on the one hand and the voltage points 18 to 21, respectively on the other hand are shown for the sake of convenience as mechanical switches which are controlled concurrently from the control unit 22. The control unit 22 may be an electro-mechanical switch—a switch which is commonly referred to as a chopper—which is commercially available. This chopper may be energized by an a.c. voltage source of the desired frequency of, for example, 50 Hz, and if necessary via a phase-delaying network.

It is obvious that many other connecting modes are alternatively possible, particularly electronic switching elements which are controlled electronically by, for example, the voltage produced by a square-wave pulse generator.

What is claimed is:

1. A driver circuit comprising a first integrated circuit amplifier, a series arrangement of first and second voltage-controlled direct voltage supply sources connected to first and second supply terminals respectively of the amplifier and having a maximum sum voltage which exceeds the breakdown voltage of the integrated circuit amplifier, the negative pole of the first supply source being connected to the positive pole of the second supply source, with the junction point of the supply sources being connected to a fixed reference voltage, and a control arrangement connected to the supply sources for controlling the individual output voltages of the supply sources in opposite directions with variations in the instantaneous value of the amplifier input signal, whereby the sum voltage of the supply sources is kept below the breakdown voltage of the integrated amplifier.

2. A driver circuit comprising a first integrated circuit amplifier, a series arrangement of first and second voltage-controlled direct voltage supply sources having a maximum sum voltage which exceeds the breakdown voltage of the integrated circuit amplifier, the negative pole of the first supply source being connected to the positive pole of the second supply source, with the junction point of the supply sources being connected to a reference voltage, and a control arrangement connected to the supply sources for controlling the individual output voltages of the supply sources in opposite directions with variations in the instantaneous value of the amplifier output signal, whereby the sum voltage of the supply sources is kept below the breakdown voltage of the integrated amplifier, the junction point of the first and second supply sources being connected to an input of the amplifier via a parallel arrangement of a first series arrangement of a third controlled direct voltage supply source and a first resistor on the one hand and a second series arrangement of a fourth controlled direct voltage supply source and a second resistor on the other hand, the negative pole of the third supply source being coupled to the positive pole of the fourth source, and a third resistor interconnecting the output and the input of the amplifier.

3. A driver circuit as claimed in claim 2, wherein the driver circuit comprises a second integrated amplifier which, for its supply, is connected to the series arrangement of the third and the fourth supply sources, the junction point of the first and the second supply sources being connected to the input of the second amplifier via a parallel arrangement of a third series arrangement of the first supply source and a fourth resistor on the one hand and a fourth series arrangement of the second supply source and a fifth resistor on the other hand, and, a sixth resistor interconnecting the output and the input of the second amplifier.

4. A driver circuit comprising a first integrated circuit amplifier having first and second operating voltage terminals, and an operating voltage supply comprising first and second voltage supplies of first and second voltages respectively of opposite polarity, said first and second voltage supplies having a common reference voltage point, the sum of the maximum values of said first and second voltages exceeding the breakdown voltage of said integrated circuit amplifier, first and second reference points having third and fourth voltages respectively of lower maximum voltage than the voltages of said first and second supplies whereby the sum of said first and third voltages and the sum of said second and fourth voltages is less than said breakdown voltage, and means for alternately applying said first and third voltages respectively and said second and fourth voltages respectively, to said first and second terminals, respectively.

5. The driver circuit of claim 4 wherein said first and second voltage supplies are constant voltage direct current supplies.

6. The driver circuit of claim 4 wherein said first and second voltage supplies have output voltages that are the sum of a full wave rectified sinusoidal AC voltage, and a direct voltage, the alternating voltages of said first and second supplies varying in the same sense.

7. The driver circuit of claim 4 further comprising third and fourth voltage supplies connected to said first and second reference points for providing said third and fourth voltages respectively.

8. The driver circuit of claim 4 wherein said means for alternately applying voltages to said first and second terminals comprises switch means controlled to alternately apply said first and third voltages and said second and fourth voltages respectively to said first and second terminals respectively at a determined frequency.

9. The driver circuit of claim 4 wherein said integrated circuit amplifier has an input terminal, and said means for alternately applying said first and third voltages respectively and said second and fourth voltages respectively to said first and second terminals respectively further comprises means applying the difference between said second and fourth voltages to said input terminal when said first voltage is applied to said first terminal and applying the difference between said first and third voltages to said input terminal when said fourth voltage is applied to said first terminal.

10. The driver circuit of claim 4 wherein said third and fourth voltages are substantially equal to the minimum collector space of said integrated circuit amplifier.

* * * * *